United States Patent
Bolz et al.

(10) Patent No.: US 7,825,638 B2
(45) Date of Patent: Nov. 2, 2010

(54) DEVICE AND METHOD FOR BALANCING CHARGE BETWEEN THE INDIVIDUAL CELLS OF A DOUBLE-LAYER CAPACITOR

(75) Inventors: Stephan Bolz, Pfatter (DE); Martin Götzenberger, Ingolstadt (DE); Rainer Knorr, Regensburg (DE)

(73) Assignee: VDO Automotive AG, Regensburg (DE)

( * ) Notice: Subject to any disclaimer, the term of this patent is extended or adjusted under 35 U.S.C. 154(b) by 421 days.

(21) Appl. No.: 12/065,543

(22) PCT Filed: Sep. 1, 2006

(86) PCT No.: PCT/EP2006/065924

§ 371 (c)(1),
(2), (4) Date: Mar. 3, 2008

(87) PCT Pub. No.: WO2007/026019

PCT Pub. Date: Mar. 8, 2007

(65) Prior Publication Data

US 2008/0252266 A1      Oct. 16, 2008

(30) Foreign Application Priority Data

Sep. 2, 2005   (DE) .................. 10 2005 041 824

(51) Int. Cl.
*H02J 7/00*   (2006.01)
(52) U.S. Cl. .................. 320/166; 320/167; 320/116; 320/118

(58) Field of Classification Search ............... 320/166, 320/167

See application file for complete search history.

(56) References Cited

U.S. PATENT DOCUMENTS

| | | | |
|---|---|---|---|
| 6,008,623 | A | 12/1999 | Chen et al. |
| 6,781,422 | B1 | 8/2004 | Yang |
| 2004/0246635 | A1 | 12/2004 | Morita |
| 2006/0164033 | A1 | 7/2006 | Bolz et al. |
| 2007/0290674 | A1 | 12/2007 | Bolz |

FOREIGN PATENT DOCUMENTS

| | | |
|---|---|---|
| DE | 10034060 A1 | 2/2002 |
| DE | 10256704 B3 | 2/2004 |
| DE | 10347110 B3 | 1/2005 |
| EP | 0432639 A2 | 6/1991 |
| JP | 10164768 A | 6/1998 |
| JP | 2003235175 A | 8/2003 |

*Primary Examiner*—Edward Tso
*Assistant Examiner*—Ahmed Omar
(74) *Attorney, Agent, or Firm*—Laurence A. Greenberg; Werner H. Stemer; Ralph E. Locher

(57) ABSTRACT

A device and a method for balancing charge between individual cells of a double-layer capacitor, in particular in a multi-voltage motor vehicle electrical system. Each individual cell of the double-layer capacitor is associated with a capacitor, the first terminal of which can be connected via a first switch to a first terminal of the associated cell and via a second switch to a second terminal of the associated cell, and the second terminal of which is connected to the second terminals of all of the capacitors.

20 Claims, 6 Drawing Sheets

DEVICE AND METHOD FOR BALANCING CHARGE BETWEEN THE INDIVIDUAL CELLS OF A DOUBLE-LAYER CAPACITOR

BACKGROUND OF THE INVENTION

Field of the Invention

The invention relates to a device for balancing charge between the individual cells of a double-layer capacitor, especially in a multi-voltage motor vehicle electrical system.

The invention also relates to a method for operating this device.

Double-layer capacitors have proved to be the most sensible technical solution for provision or storage of short-duration high power such as in supporting acceleration by means of electric motors (boost operation) or the electrical conversion of kinetic energy in regenerative braking in so-called "mild" hybrid vehicles.

The maximum voltage of a double-layer capacitor individual cell is however limited to appr. 2.5 V to 3.0V, so that for provision of a voltage of for example 60V (a typical value for 42V vehicle electrical systems) appr. 20 to 25 individual cells are to be connected in series to form a capacitor stack.

The different self-discharge rates of the individual cells cause a charge imbalance to build up over the course of time in the double-layer capacitor, which would eventually make it unusable.

The range of variation of the self-discharge of the individual cells within a capacitor module can be very large. If this is extrapolated to periods of weeks or months, as is relevant for the use of a motor vehicle, the problem which exists becomes obvious.

A simple charge balance, by slight overcharging as in a lead-acid battery (starter battery), is not possible with double-layer capacitors.

A known option consists of monitoring the voltage of each individual cell by means of separate electronics and, when a maximum value for the cell voltage is reached or exceeded, of instigating a deep discharge by means of a connectable parallel resistor (shunt). The cell then discharges itself via the shunt and its voltage drops below the maximum value again.

If the maximum value is undershot by a specific voltage, the shunt is switched back off and no further charge is removed from the capacitor.

Such a circuit consumes little energy in the passive state, but the charge balance is achieved by reducing the charge (energy loss in the module). It is sensible to employ this variant where a capacitor stack is predominantly operated close to its maximum voltage; for supply power to emergency generator sets for example.

The concept is however restricted to the charge current of the capacitor module having to be smaller than the discharge current, since otherwise overcharging of individual capacitors during the charging of the module is still possible. In addition the balancing system cannot be switched on from outside, but can only be activated by the maximum voltage being exceeded. However this is precisely the state which is not reached over the long term during operation in a motor vehicle, which in the final analysis leads to an asymmetry in the capacitor module. This has already been able to be verified by measurements in a test vehicle. In summary the system has the following disadvantages:

No feedback to a higher-level operational control as to whether a capacitor has exceeded the maximum voltage ($U_c$>2.5V);

No feedback as to whether the capacitor voltages are equal and thus whether the capacitor module is balanced;

Balancing will only be activated if the voltage is exceeded;

Energy will be converted into heat by resistors during the balancing.

Another known option consists of using a—likewise known—flyback switching controller, with energy now being removed from the entire capacitor module and this then being fed back into the individual capacitor which is the most discharged. Such a solution is known from EP 0432639 A2.

Alternatively another source of energy—such as an accumulator—can be used, which enables the circuit to be used additionally for slow charging of the capacitor module. See Patent Application DE 102 56 704 for more information.

This form of charge balancing can in addition be undertaken at any time regardless of the maximum voltage of an individual cell having been reached, so that a dangerous charge imbalance in the double-layer capacitor cannot even build up to start with.

In addition charges are only moved in such cases, meaning that energy is not removed from the module over the long term. This makes the concept especially attractive for motor vehicle applications, since even after the vehicle has been standing for long periods, there must still be enough energy in the vehicle electrical system present to safely ensure a successful motor start.

Currents of up to appr. 1 kA also arise during the "regenerative braking" function of the vehicle described above, so that charge balancing according the first known option is excluded in this situation.

The disadvantage of this expanded embodiment however is that the secondary side of the flyback transformer requires very many terminals. For a capacitor stack with for example 25 individual cells, as is needed in a 42V vehicle electrical system, this produces 50 terminals. In the technical implementation this would make a special coil core necessary, which is not commercially available. Also any change in the number of cells in the stack additionally requires adaptation of the transformer.

Changes to numbers of individual cells are to be expected however, since with the further technical development of double-layer capacitors the permitted maximum voltage will increase from generation to generation and for a given overall voltage correspondingly fewer individual cells will be needed.

The routing of lines from transformer to the capacitors is very expensive, since each contact in the module must be connected separately. In the above example this produces 26 lines, provided the rectifier diodes are arranged at the transformer; otherwise there are 50 lines.

In addition these lines are adversely affected by high-frequency voltage pulses from the switching processes of the flyback converter and need special EMC noise suppression measures.

A further aspect is the method for operation of the flyback converter. Commercially-available control circuits (switching controller ICs) operate almost exclusively at a fixed switching frequency. The charging of the magnetic store (storage inductance or transformer) takes place in the one phase, the discharging or transmission of energy into the output circuit in the other phase of the cycle. This is particularly sensible if a direct current component is transmitted in addition to the switched current (ripple-free operation). In quite general terms an attempt is made to avoid a switching gap—i.e. a period in which the magnetic storage element remains fully discharged, since then oscillation tendencies increasingly occur and the storage characteristics of the magnetic core cannot be used in the optimum manner. The reasons for the oscillations lie in the resonant circuit which consists of storage inductance and winding capacitance as well as the fact that the resonant circuit is excited at the beginning of the switching gap and is not attenuated by any resistive load.

In the application described ripple-free operation is not possible however, since with continuous recharging of the magnetic store (storage inductance or transformer) a saturation of the core material is not to be avoided before its complete discharging.

BRIEF SUMMARY OF THE INVENTION

The object of the invention is to create a device for charge balancing between the individual cells of a double-layer capacitor in a multi-voltage motor vehicle electrical system which makes it possible to simplify the structure of the circuit and the routing of lines to the individual capacitors of the module; In addition it is to be possible to monitor the functions of the charge balancing circuit and of the individual cells; The circuit is essentially to be built from standard components and is to be especially suitable for connecting to the cell stack or to the individual cells; The overall system is to be simple to expand and thereby easily scalable. The object of the invention is also to specify a method for operating this device.

In accordance with the invention this object is achieved by a device as claimed in the features of claim 1 and a method as claimed in the features of claim 10.

Advantageous developments of the invention are to be taken from the subclaims.

The drawing shows the following:
BRIEF DESCRIPTION OF THE SEVERAL VIEWS OF THE DRAWING FIG. 1: a basic circuit according to the invention;

FIG. 2: a first exemplary embodiment of a single version of the inventive circuit;

FIG. 3: a second exemplary embodiment of a differential version of the inventive circuit;

FIG. 4: an activation circuit for the switching transistors;

FIG. 5: a recharging circuit for the single version of the circuit;

FIG. 6: a recharging circuit for the differential design of the circuit;

FIG. 7: a basic circuit diagram of a rectifier;

FIG. 8: an exemplary embodiment of a rectifier restricted to a single charge balancing circuit; and FIG. 9: an exemplary embodiment of a rectifier expanded to a differential charge balancing circuit.

DESCRIPTION OF THE INVENTION

To be able to achieve charge balancing of the individual cells of a double-layer capacitor, energy is to be taken from the cells which have the highest voltage and fed via a suitable circuit to the capacitors with the lowest voltage. A basic block diagram of an exemplary embodiment according to the invention is shown in FIG. 1.

FIG. 1 shows a double-layer capacitor which consists of a series circuit (stack) of individual capacitor cells C1 to Cn.

Each capacitor cell C1 to Cn (simply referred to as "cell" below) is assigned to a capacitor C1a to Cna, the first terminal of which
- can be connected via a first switch S1a to Sna to the first terminal of the assigned cell C1 to Cn, and
- can be connected via a second switch S1b to Snb to the second terminal of the assigned cell C1 to Cn.

The second terminals of capacitors C1a to Cna are connected to each other.

The inventive method for determining the cell voltages, knowledge of which is required for charge transfer or recharging of specific cells, will be described later.

All of the method steps described below are basically executed under program control by means of microprocessors not shown in the figures.

The two switches S1a and Sna are switched off and on synchronously with a predetermined frequency and switches S1b and Snb are also switched on and off in a push-pull arrangement with them.

If voltages $V_{C1}$ and $V_{Cn}$ at the cells C1 and Cn are the same, no current will flow during switching.

If voltages $V_{C1}$ and $V_{Cn}$ at cells C1 and Cn are different however, a current corresponding to the voltage difference will flow from the cell with the higher charge voltage to the cell with the lower voltage, for example from cell C1 to cell Cn. This moves charge from the more highly charged cell to the less highly charged cell, so that the charge can be balanced between these two cells without affecting the remaining cells.

A pulsing direct current flows in cells C1 and Cn, whereas an alternating current flows in the cells C2 to Cn−1 between these two cells.

FIG. 2 shows an exemplary embodiment of the circuit according to FIG. 1. Switches S1a to Snb from FIG. 1 are embodied here as MOSFET switching transistors T1a to Tnb, with the first terminals of capacitors C1a to Cna being connected to the source terminals of first switching transistors T1a to Tna and connected to the drain terminals of second switching transistors T1b to Tnb. The drain terminals of the first switching transistors T1a to Tna are connected to the first terminals of the cells C1 to Cn assigned to them, whereas the source terminals of the second switching transistors T1b to Tnb are connected to the second terminals of the cells C1 to Cn assigned to them.

In parallel to each cell C1 to Cn is arranged a series circuit of two resistors R1a-R1b to Rna-Rnb, the connection points of which are connected to the first terminals of the capacitors C1a to Cna assigned to them. Switching transistors T1a to Tnb are operated as switches.

As an initial condition for the inventive method
- let all switching transistors T1a to Tnb be non-conductive;
- let capacitors C1a to Cna be charged so that there is only a small voltage present at the switching transistors T1a to Tnb, which is achieved by the resistors R1a-R1b to Rna-Rnb;
- let cell C1 have a high charge voltage and cell Cn a low charge voltage;
- charge balancing is to take place by moving charge from cell C1 to cell Cn.

In accordance with the inventive method for charge balancing the second switching transistors T1b and Tnb of the cells to which the charge is to be transferred will first be switched to conductive. An initial balancing current flows from the first terminal of cell C2 via the second switching transistor T1b, the capacitors C1a and Cna and also the second switching transistors Tnb to the second terminal of cell Cn, until the series circuit comprising C1a and Cna has reached the voltage $V2=V_{C2}+\ldots+V_{Cn-1}+V_{Cn}$ of the capacitor stack element C2 to Cn.

Let the voltage $V2=V_{C2}+\ldots+V_{Cn-1}+V_{Cn}$ at the series circuit of the capacitors C1a and Cna be the start point of the following method:

The second switching transistors T1b and Tnb are now switched to non-conducting and the first switching transistors T1a and Tna are switched to conducting. The stack element of the cells C1 to Cn−1 connected by this action is however at a different higher voltage $V1=V_{C1}+V_{C2}+\ldots+V_{Cn-1}$ from the series circuit of the two capacitors C1a and Cna (V2):

$$V1=V_{C1}+V_{C2}+\ldots+V_{Cn-1}$$

$$V2=V_{C2}+\ldots+V_{Cn-1}+V_{Cn}$$

Thus a differential voltage of:

$$dV1=V1-V2=V_{C1}-V_{Cn} \text{ is produced.}$$

Since, as defined at the start, $V_{C1}>V_{Cn}$, the differential voltage dV1 has a positive value and a current corresponding to the voltage difference dV1 flows from the first terminal of the cell C1 via T1a, C1a, Cna, Tna and via the cell stack Cn−1 to C1 back to the start point. The two capacitors C1a and Cna are now connected to the voltage V1.

If the first switching transistors T1a and Tna are now again switched to non-conductive and the second switching transistors T1b and Tnb are also switched to conductive, the voltage V1 is connected to the capacitors C1a and Cna, whereas the voltage at stack element C2+ . . . +Cn now amounts to V2.

The differential voltage dV2 has a negative value:

$$dV2=V2-V1$$

which causes the current flow through the capacitors C1a, Cna to reverse.

Thus in the first phase charge flows from cell C1 into the capacitors C1a, Cna and in the second phase charge flows out of the capacitors C1a, Cna into the cell Cn. This means that charge has been transferred from the more highly-charged cell C1 to the less highly charge charged cell Cn.

In the remaining cells C2 to Cn−1 the currents have a positive or a negative leading sign, depending on the switching phase. Thus effectively no charge movement occurs here.

In a further exemplary embodiment in accordance with FIG. 3 the charge balancing circuit is expanded by duplicating the circuit in accordance with FIG. 2.

The two circuits are operated in push-pull mode, so that now in one cycle the switching transistors T1a and Tna as well as T1d and Tnd and in the next cycle the switching transistors T1b and Tnb as well as T1c and Tnc are then simultaneously switched to conductive.

The result achieved is that current flows in each switching phase from the more highly charged cell to the less highly charged cell, which accelerates the charging process and—in relation to the cells—the pulsed current waveform is improved to a uniform shape (direct current) waveform.

The alternating current flowing through the intermediate cells (in the said exemplary embodiment C2 to Cn−1) is also completely removed.

Since the voltage potentials of the switching transistors T1a to Tnd shown in FIGS. 2 and 3, as a result of their arrangement, lie approximately on the level of the cells C1 to Cn assigned to them, a simple activation with ground reference is only possible to a limited extent.

A circuit is thus required which allows an activation of the switching transistors independently of the dc voltage potential. There must also be automatic switch-off if the switching transistors are incorrectly activated in order to prevent damage to the components if the incorrect switch-on last for a long period.

Figure 4:
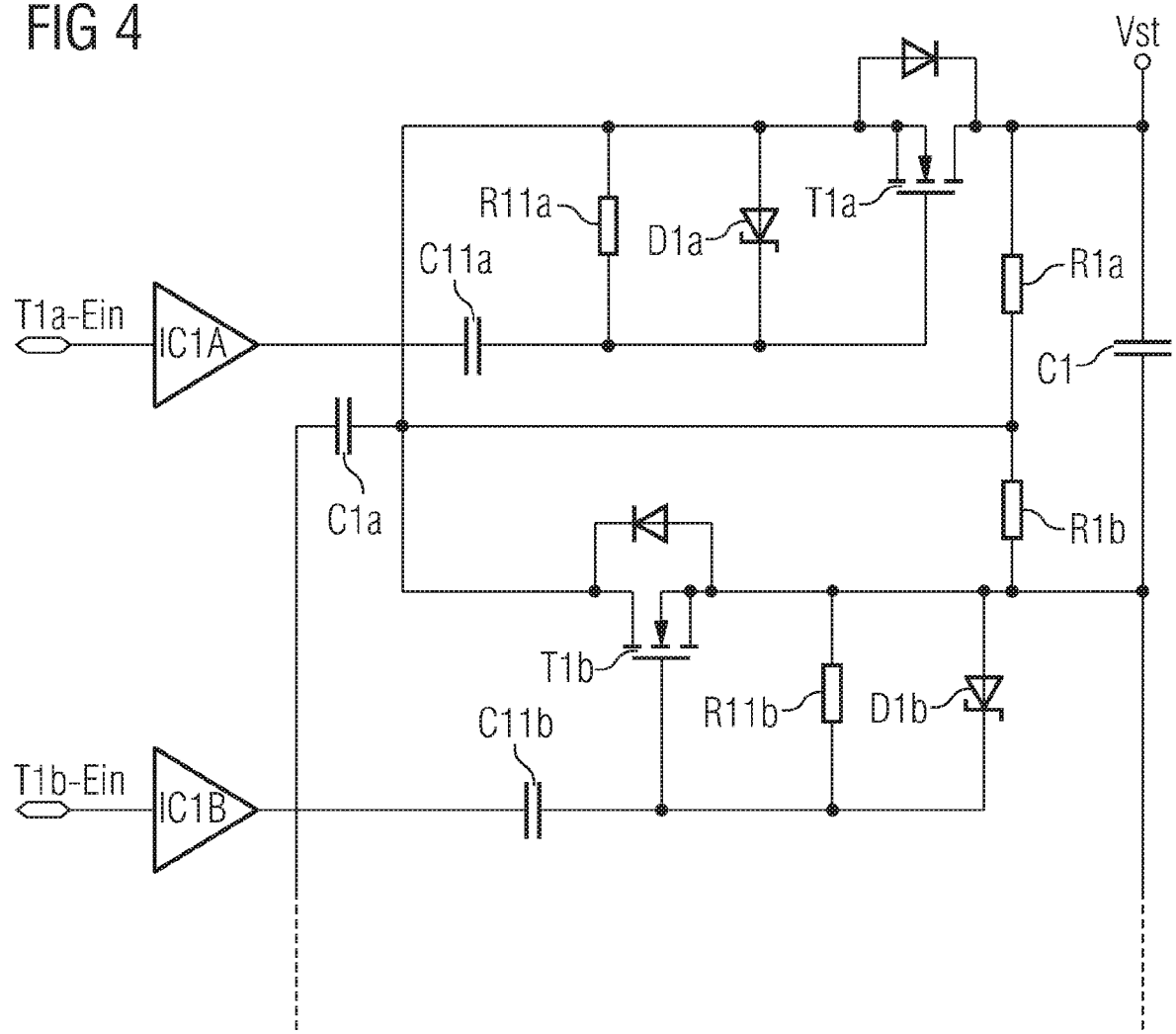
FIG. 4 shows an activation circuit of this type for the switching transistors. The function of this circuit is explained using the switching transistors T1a and T1b shown in FIGS. 2 and 3 as examples and then applies in the same way for all remaining switching transistors T2a to Tnd of the circuits in the FIGS. 2 and 3.

The switching transistors T1a and T1b are activated in the exemplary embodiment according to FIG. 4 for example by capacitive coupling of the control signals T1a-Ein, T1b-Ein via a coupling capacitor C11a, C11b in each case, which still requires a clamping to the source potential of the respective switching transistor, which is undertaken by a Zener diode D1a, D1b and a resistor R11a, R11b in each case, which are connected between source and gate terminal of the assigned switching transistors T1a, T1b, with the cathode terminal of the Zener diode being connected to the gate terminal of the assigned switching transistor.

A logic buffer IC1A, IC1B serves in each case to amplify the current of the control signals T1a-Ein, T1b-Ein. Arranged between its output and the gate terminal of the assigned switching transistors T1a, T1b is the coupling capacitor C11a or C11b.

At the beginning of a switching process the switching signals T1a-Ein and T1b-Ein should be at low level and the terminals connected to the outputs of the logic buffer IC1A and IC1B of the capacitors C11a and C11b should have 0 V potential.

At the terminal of the capacitor C11a, C11b connected to the gate terminal of the switching transistor T1a, T1b —as a result of the resistor R11a, R11b —there is the source potential of the switching transistor T1a, T1b. Thus the gate-source voltage of the switching transistors T1a, T1b amounts to 0 V and switching transistor T1a, T1b is non-conductive.

The terminal of the capacitor C1a connected to the source terminal of switching transistor T1a and the drain terminal of switching transistor T1b is set by the voltage divider R1a-R1b (both resistors have same values) to half the voltage present at cell C1.

If signal T1a-Ein now switches to high level, (with a suitable selection of the values of C11a and R11a) the gate-source voltage of the switching transistor T1a will rise by around the value of the voltage jump at the output of the logic buffer IC1A and switch switching transistor T1a to conductive.

It should be guaranteed that the voltage jump is large enough by comparison with the inrush voltage of switching transistor T1a. Zener diode D1a in this case limits the gate-source voltage to a value permissible for the switching transistor. As the process proceeds, capacitor C11a will discharge slightly via resistor R11a, without however falling below the inrush voltage of switching transistor T1a.

If control signal T1a-Ein then jumps to low level, the gate-source voltage at switching transistor T1a likewise falls by the same amount as the control signal T1a-Ein (the output voltage of the logic buffer C1A). Since capacitor C11a is slightly discharged however, the gate-source voltage will now become negative. This is however restricted to a value of appr. −0.7V, since the Zener diode D1a is now polarized in the direction of the flow and thus clamps the voltage. At the same time the capacitor C11a is again recharged to its original value, so that the next switch-on process can be undertaken in the same way.

The control signals T1a-Ein and T1b-Ein have alternating high and low level in charge balancing operation.

Although the circuit arrangements previously described can execute charge balancing between individual or between a number of cells in the double-layer capacitor stack, they do not however overall effect a recharging of the stack from an external source of energy.

Recharging can be necessary if the overall voltage of the double-layer capacitor falls below a predetermined minimum value. The total of the stored values of the charge voltage $V_{C1}$ to $VC_n$ can be formed simply and compared to the predetermined minimum value. When this minimum value is undershot, individual cells, cell groups or the entire double-layer capacitor can be recharged from an external source of energy.

Figure 5:
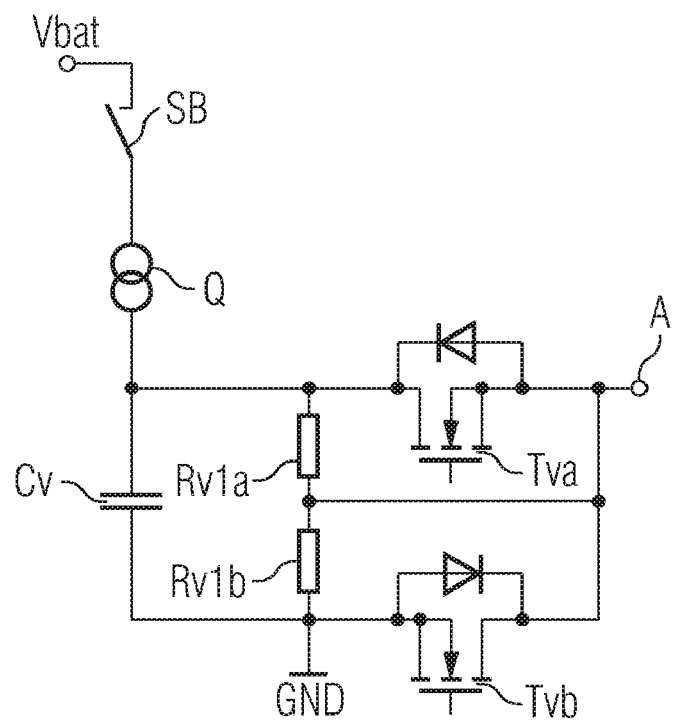
Figure 6:
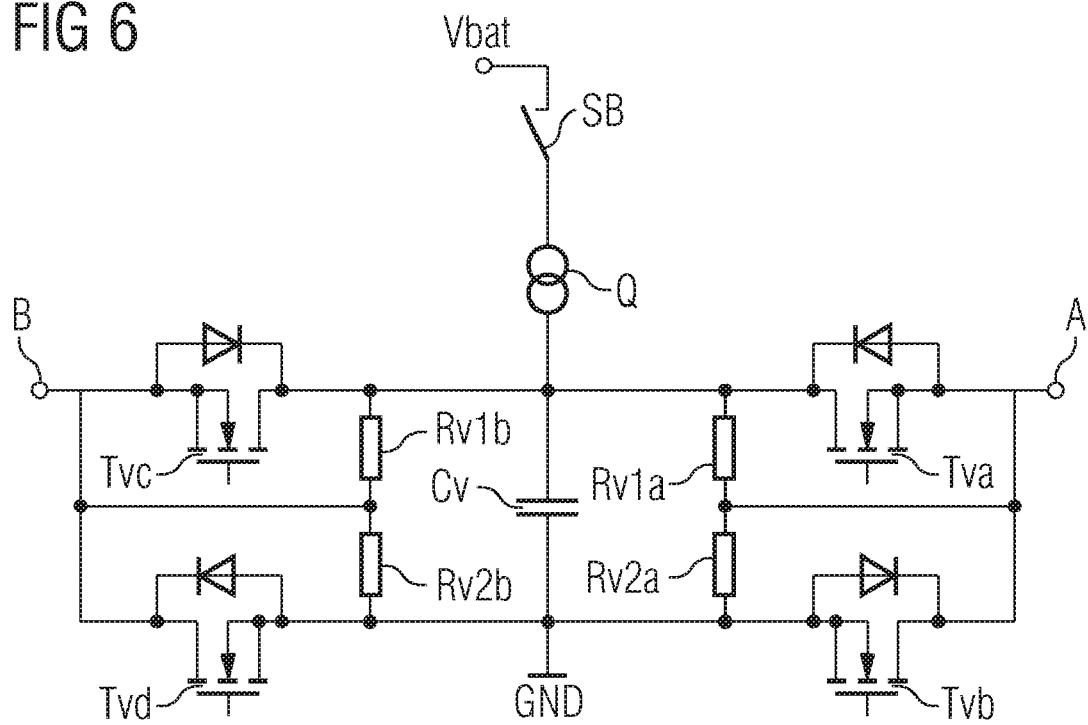

If recharging is not to be (or cannot be) undertaken via the terminal Vst of the double-layer capacitor there is the option of doing this for example via a vehicle voltage source Vbat by means of an additional switchable recharging capacitor Cv, as is shown for the single charge balancing circuit in FIG. 5 or for the differential charge balancing circuit in FIG. 6.

The recharging circuit in accordance with FIG. 5 consists of a recharging capacitor Cv, one terminal of which is at reference potential GND and which is charged via a switchable current source Q with constant current from an external source of energy, for example a vehicle electrical system power source Vbat via a switch SB to a predetermined voltage. Arranged in parallel to the recharging capacitor Cv is a voltage divider comprising two equal-size resistors Rv1a, Rv2a.

Furthermore
a switching transistor Tva is provided, the drain terminal of which is connected to the connecting point of current source Q and recharging capacitor Cv and the source terminal of which leads to a node A and is simultaneously connected to the connecting point of the two resistors Rv1a, Rv2a, and a switching transistor Tvb is provided, the drain terminal of which is connected to node A and the source terminal of which is connected to reference potential GND.

Since the two switching transistors Tva and Tvb act on the connecting nodes A (see FIG. 2) of capacitors C1a to Cna, charge can now be transferred by simultaneous switching of switching transistors Tva and T1a, or phase-opposed to them Tvb and T1b from the recharging capacitor Cv to the cell C1 or to another cell. This explicitly allows individual cells in the stack to be recharged.

The same size resistors Rv1a, Rv2a make sure that the connecting node A lies at half the dc voltage potential of the recharging capacitor Cv.

If the charge voltages in the cell stack or a subset thereof are the same, by simultaneously switching the switching transistors assigned to these cells charge can be transmitted to the entire cell stack or to the subset.

The above then applies in equal measure to the switching transistors Tvc and Tvd as well as to the connection node B for the differential version in accordance with FIG. 6, which consists of duplicating the circuit according to FIG. 5. In this exemplary embodiment the recharging process is accelerated.

Figure 1:
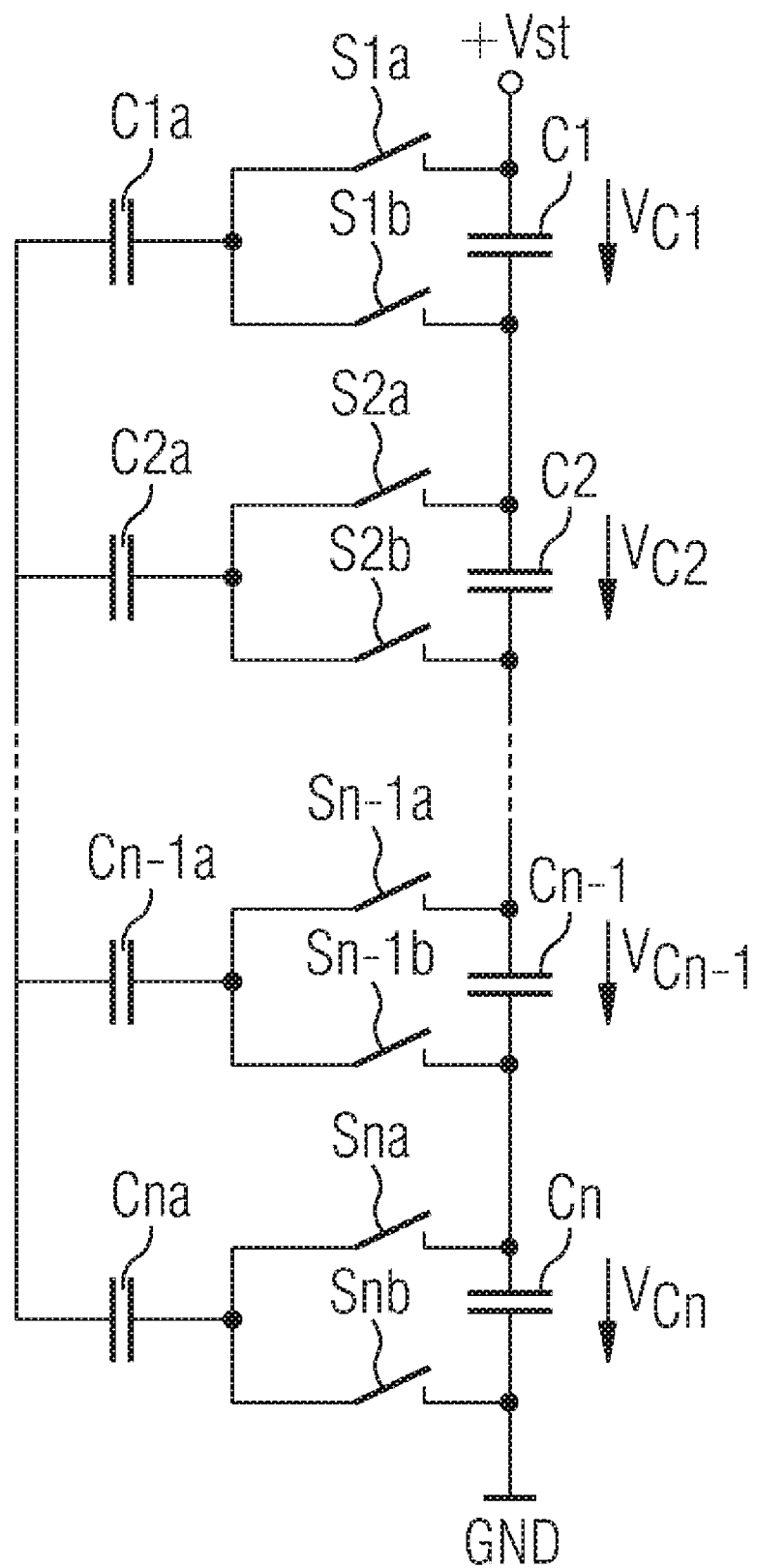
Figure 2:
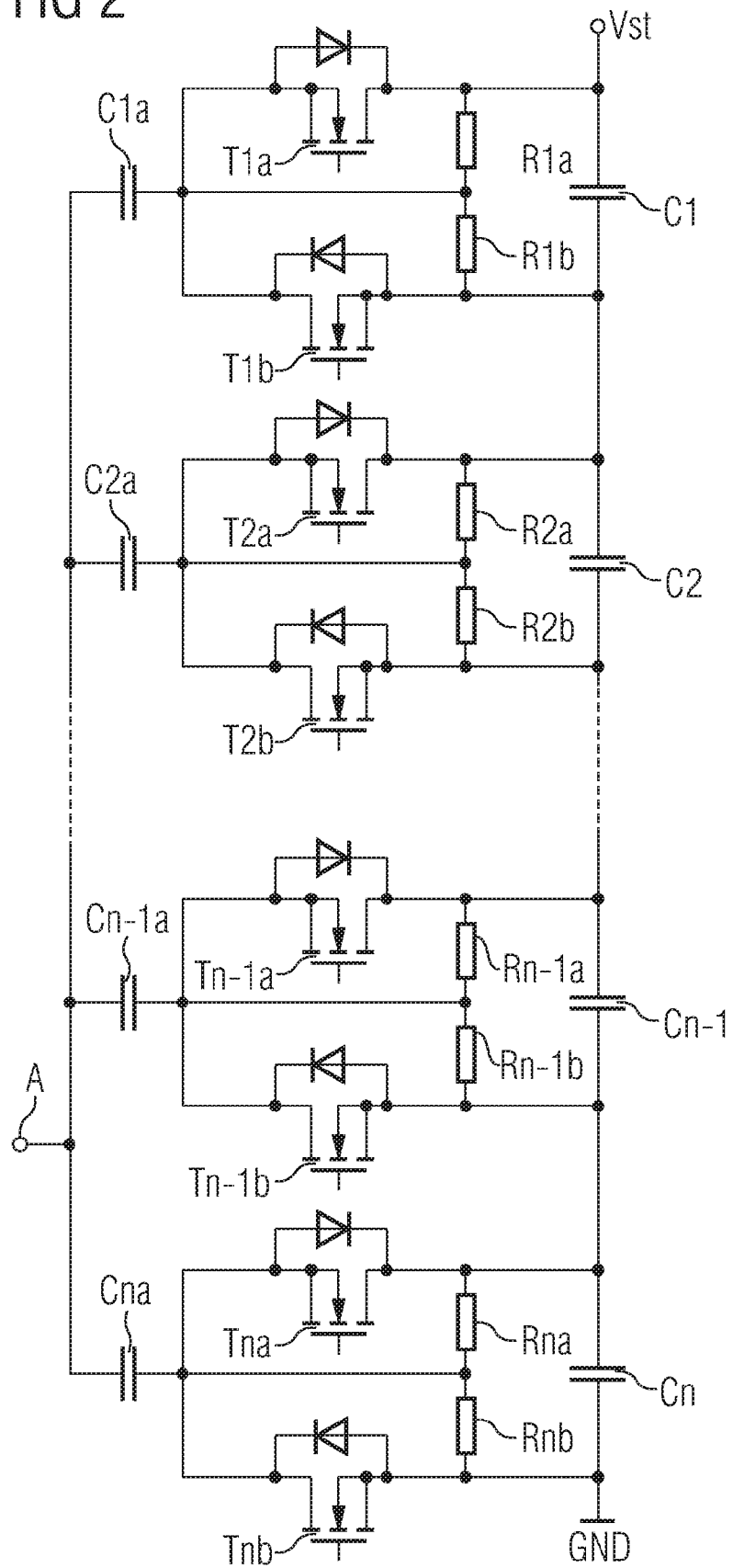
FIGS. 2 and 3 show switching transistors T1a and T1b themselves and the series circuit of two resistors R1a-R1bc arranged in parallel to cell C1, the connection point of which is connected to the capacitor C1 assigned to cell C1. The gate terminals of the two switching transistors, via which the activation is undertaken, are however not connected there.
Figure 3:
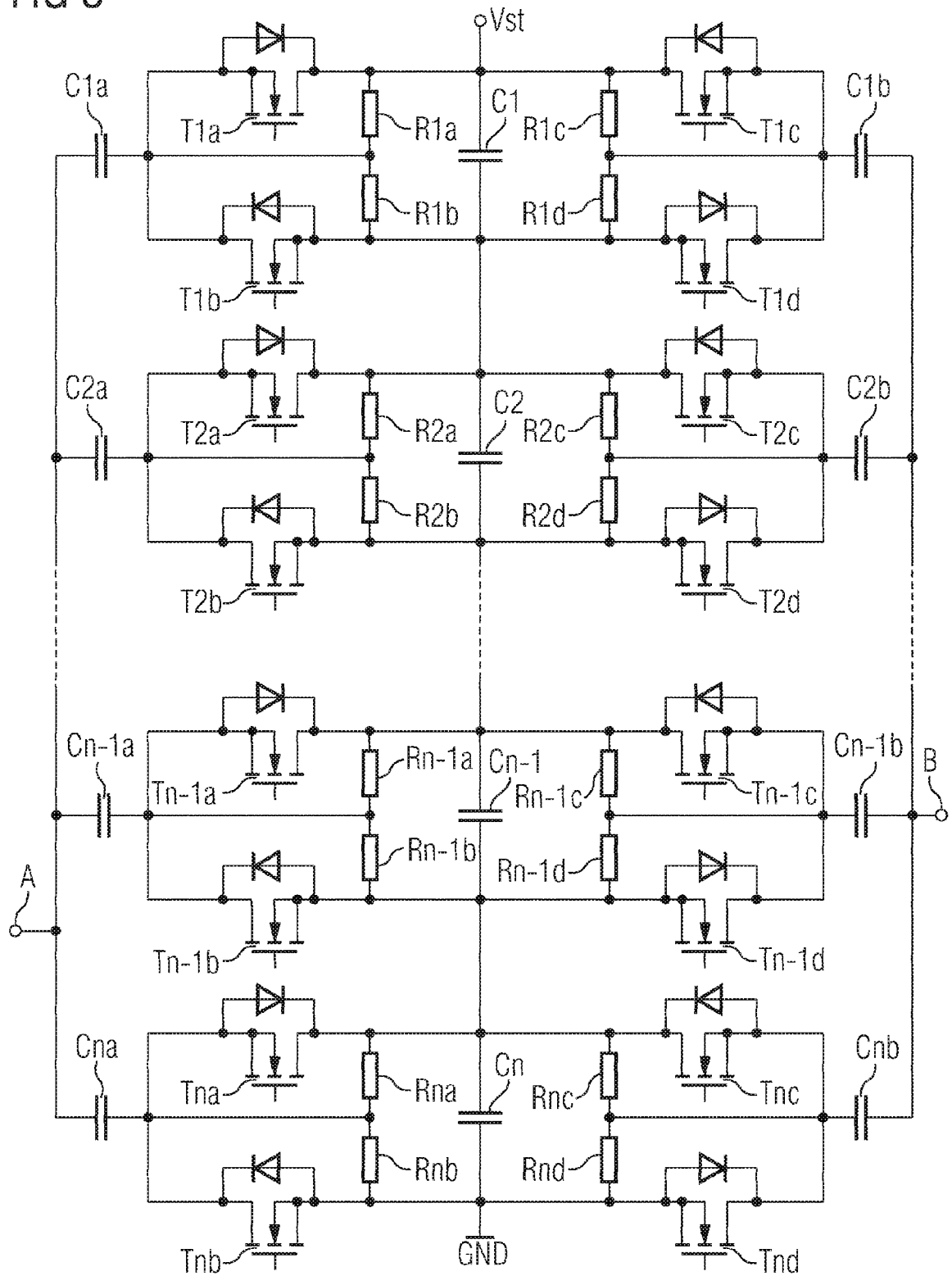

By suitable activation of the circuit in accordance with FIGS. 2 and 3 it is very easily possible to establish the charge voltage of each cell C1 to Cn in the stack with high accuracy.

To do this all switching transistors T1a to Tnb (FIG. 2) or T1a to Tnd (FIG. 3) are initially switched to non-conductive. Now switching transistors T1a and T1b assigned to a cell, for example C1, are alternately switched to conductive (in which case, for the circuit depicted in FIG. 3, the switching transistors T1a and T1d as well as phase-opposed thereto T1b and T1c are simultaneously switched).

This gives rise to a square wave ac voltage at nodes A or A and B for which the peak-to-peak value corresponds to the charge voltage of cell C1. The phase-opposed actuation of switching transistors T1a and T1b or T1c and T1d respectively means that the signals at the nodes A and B are likewise phase-opposed. The dc voltage value of nodes A and B—as already described above—amounts to half the value of the charge voltage of the recharging capacitor Cv. This dc voltage value is overlaid by the square-wave ac voltage.

Nodes A or A and B—as well as being connected to the recharging circuit—are also connected to terminals A or A and B of a rectifier, which rectifies the square-wave ac voltage into a dc voltage related to a reference potential GND.

Figure 7:
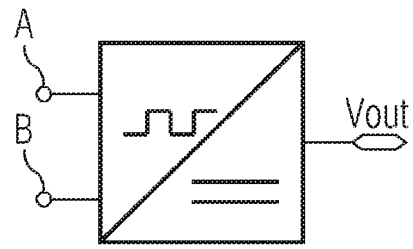

The principle of this type of rectification is shown in FIG. 7. If the charge voltage of cell C1 for example is determined and stored by measurement of the output voltage Vout of the rectifier, the switching transistors T1a and T1b or T1a to T1d assigned to the cell C1 are once again switched to non-conductive.

Subsequently the charge voltage of cell C2 or of another cell can be detected by corresponding switching of the assigned switching transistors at output Vout of the rectifier.

In this way the charge voltage can be determined and stored for all cells of the stack in turn.

If no recharging circuit (as per FIGS. 5, 6) is used, then by insertion of a resistor between node A or B and a reference voltage—around 2.5V—the dc voltage potential of this node can be applied to a reference potential.

This process now allows the charge voltage of a selected capacitor (e.g. C1) to be successfully translated from what may be a high direct current potential into an alternating current with reference to a reference potential.

The alternating current can then be transformed with a suitable rectifier into a direct current corresponding to the peak-to-peak value with reference to a reference potential GND. This makes it suitable for further processing—for example at the input/output of a microcontroller.

Figure 8:
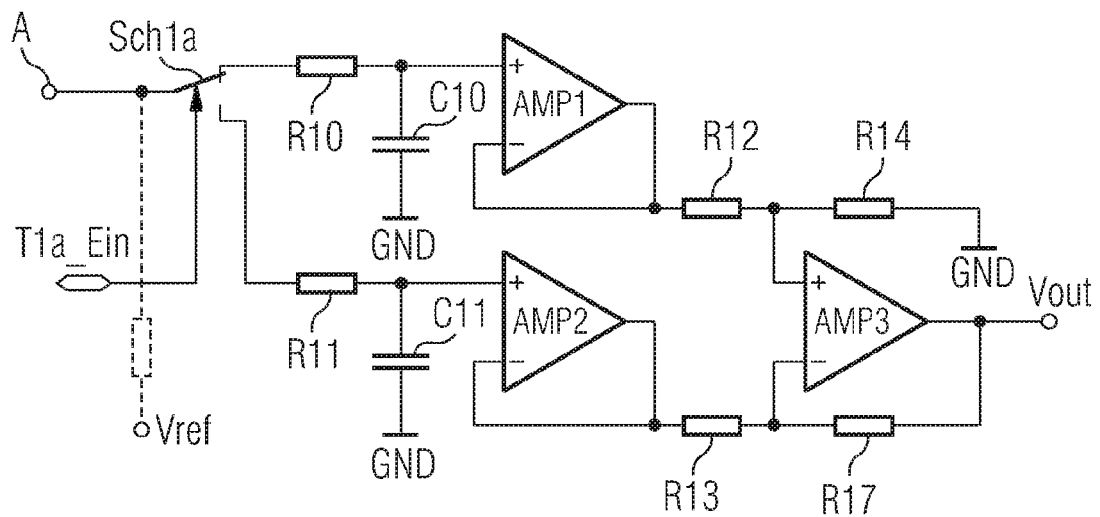

FIG. 8 shows an exemplary embodiment known per se of a rectifier restricted to the single charge balancing circuit in accordance with FIG. 2 embodied as a synchronous demodulator for the evaluation of the cell voltages (see also DE 100 34 060, FIG. 5 and associated description).

The inputs of the rectifier are to be connected via a changeover switch Sch1a to node A (the connection of capacitors C1a to Cna) of the balancing circuit according to FIG. 2. The control signal of the changeover switch Sch1a corresponds to the signals T1a-Ein to Tna-Ein described in FIG. 4, with the signal assigned to the respective capacitor to be measured C1 to Cn being selected.

By a simple expansion of the rectifier circuit according to FIG. 8 the circuit is also made suitable for rectification of differential signals in the exemplary embodiment of the charge balancing circuit according to FIG. 3.

This merely involves adding a changeover switch Sch1b in addition to changeover switch Sch1a, with both changeover switches being switched by means of the control signal of the switching transistor assigned to the respective cell C1 to Cn to be measured (for cell C1 this is the control signal T1a-Ein, for cell Cn it is the control signal Tna-Ein), so that in one phase node A is connected to input A of the rectifier (operational amplifier AMP1) and node B to input B of the rectifier (operational amplifier AMP2) and in the other phase node A will be connected to input B and node B to input A.

Figure 9:
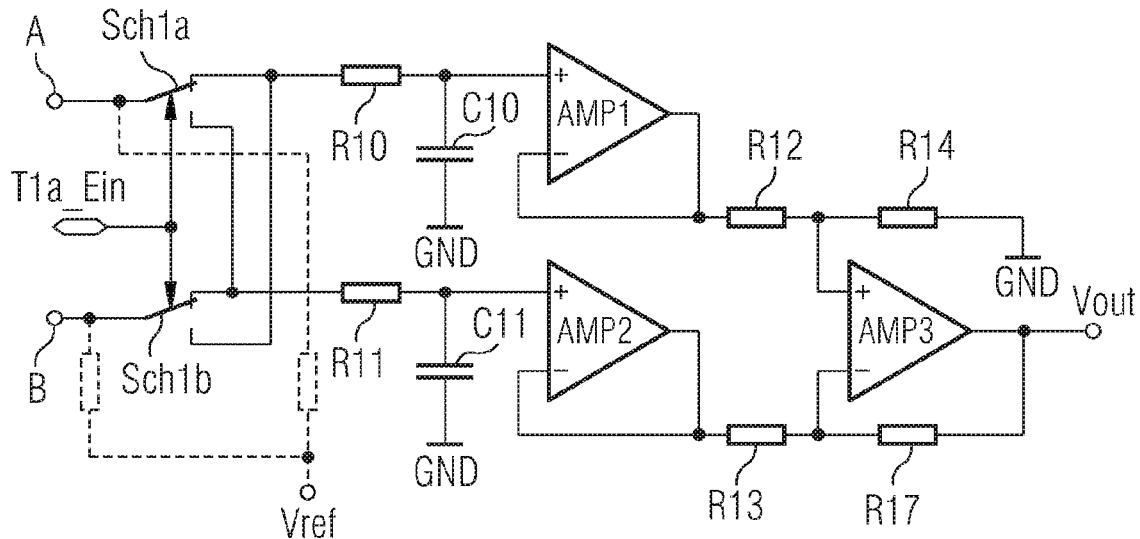

An exemplary embodiment of this type is shown in FIG. 9. The signal T1a-Ein is used as a control signal for measuring the charge voltage of a cell of cell C1. The control signals T2a-Ein to Tna-Ein are to be used accordingly for measuring the cells C2 to Cn.

In operation at a capacitor stack a sensible sequence of functions is produced which can be processed by a microcontroller program.

Inventively the following method sequence is initiated at specific predetermined intervals:

Measurement of the charge voltage of all cells; to this end—as described above—the switching transistors assigned to the respective cell to be measured are switched, the charge voltage VC of the cell is measured and stored;

Determining whether charge balancing is necessary; the stored values of the charge voltage of all cells are compared in respect of their differences; if one or more differences lie above a predetermined limit value, the charge must be balanced between the cells with differences which are too great.

The charge voltages are compared with a predetermined maximum value. If one or more values lie above this maximum value, there must be part discharging by charge balancing with the cells with the lowest charge:

Charge balancing between the cells determined in this way;

Periodic measurement of the charge voltages of the cells involved in the charge balancing;

Ending the balancing process if the charge voltages of the cells are sufficiently balanced.

If the aim is for the fastest possible charge balancing, as an alternative all the switching transistors assigned to the cells can be switched, i.e. simultaneously T1$a$ to Tna and T1$d$ to Tnd in the first phase, as well as simultaneously T1$b$ to Tnb and T1$c$ to Tnc in the second phase. The current in the individual switching transistors will not increase in relation to the balance between two cells but the charge moved per unit of time may well do so. This is significantly more efficient than other methods, where charge is transferred from the entire stack to the cell with the lowest charge voltage.

If a recharging circuit in accordance with FIG. 6 is used, then an individual cell can be recharged. This makes sense particularly when for example, as a result of ageing of a cell, there is evidence of significantly increased self-discharging;

any given subset of cells is recharged; this makes particular sense if cells with different characteristics (capacitance, self-discharge) are combined in the stack and the subset is to be balanced with the rest of the stack;

the entire capacitor stack can be recharged if the stack is balanced but overall has a charge voltage which is too low.

If no recharging circuit is used then in single operation a resistor is to be provided, one terminal of which is to be connected to node A of the charge balancing circuit, and the other terminal of which is to be applied to a reference voltage Vref (for example +2.5V) (shown by a dashed line in FIG. 8), for differential operation, for each node A, B of the charge balancing circuit a resistor is to be provided, one terminal of which is to be connected to node A or B, and the other terminal of which is to be applied to a reference voltage Vref (for example +2.5V) (shown by a dashed line in FIG. 9).

ADVANTAGES OF THE INVENTION

The efficiency of the circuit is very high;

There are only slight losses as a result of switching transistors operated as switches;

The connection and potential separation of the cells is undertaken via capacitors;

Only few and low-cost components are needed for the circuit;

The voltage of each individual cell in the stack can be measured simply and highly accurately;

A balancing process can be activated at any time;

The energy for charge balancing does not have to be taken from the overall stack, but can be taken explicitly from a specific (the highest charged) cell;

The circuit allows a highly-efficient explicit charge balancing between individual cells or cell groups of the stack and of the entire stack;

With a suitable choice of circuit (differential circuit) the charge is balanced between any two cells without an alternating current load on the intervening cells;

Charge balancing is possible even in the event of a fault (e.g. short circuit) in the cell—the circuit assigned to the cell involved will then simply no longer be activated;

Recharging of individual cells or cell groups and of the entire stack is possible;

The circuit is especially effective because respective circuit parts can be used multiple times for different functions;

The overall system is simple to expand and thus easily scalable.

The invention claimed is:

1. A device for charge balancing between individual cells having first and second terminals in a double-layer capacitor, especially in a multi-voltage motor vehicle electrical system, the device comprising:

capacitors each being assigned to a respective one of the individual cells of the double-layer capacitor, said capacitors each having first and second terminals;

first switches each for connecting said first terminal of one of said capacitors to the first terminal of the respective assigned cell;

second switches each for connecting said first terminal of one of said capacitors to the second terminal of the respective assigned cell; and said second terminals of all of said capacitors being interconnected; wherein said first and second switches are MOS-FET switching transistors having source and drain terminals in a charge balancing circuit for single operation;

said first terminals of said capacitors are each connected to said source terminal of a respective one of said first switching transistors and to said drain terminal of a respective one of said second switching transistors;

a node is connected at said interconnected said second terminals of said capacitors;

said drain terminals of said first switching transistors are each connected to said first terminal of the respective assigned cell; said source terminals of said second switching transistors are each connected to said second terminal of the respective assigned cell; and series circuits of two resistors are each connected in parallel to a respective one of the cells and each have a connection point connected to said first terminal of said respective assigned capacitor.

2. The device according to claim 1, wherein:

said first and second switches are MOS-FET switching transistors having source and drain terminals in another charge balancing circuit for differential operation connected in parallel with said charge balancing circuit for single operation;

said first terminals of said capacitors are each connected to said source terminal of a respective one of said first switching transistors and to said drain terminal of a respective one of said second switching transistors;

another node is connected at said interconnected second terminals of said capacitors;

said drain terminals of said first switching transistors are each connected to the first terminal of the respective assigned cell;

said source terminals of said second switching transistors are each connected to the second terminal of the respective assigned cell; and series circuits of two resistors are each connected in parallel to a respective one of the cells and each have a connection point connected to said first terminal of said respective assigned capacitor.

3. The device according to claim 1, which further comprises an activation circuit for each of said switching transistors, including:
  a series circuit of a logic buffer and a coupling capacitor for conveying an activation signal to a gate terminal of a respective one of said switching transistors;
  a Zener diode connected between said source and gate terminals of said respective one of said switching transistors and having a cathode connected to said gate terminal; and
  a resistor connected in parallel to said Zener diode.

4. The device according to claim 1, which further comprises:
  a recharging circuit including:
    a switch connected to an external source of energy;
    a switchable current source receiving constant current through said switch from the external source of energy; and
    a recharging capacitor having one terminal connected to reference potential and another terminal connected to said switchable current source at a connection point for charging; and
  for single operation:
    a voltage divider connected in parallel to said charging capacitor and having two resistors of equal size with a connection point therebetween;
    a switching transistor having a drain terminal connected to said connection point of said current source and said recharging capacitor and a source terminal connected to said node and to said connection point of said two resistors; and
    another switching transistor having a drain terminal connected to said node and a source terminal connected to reference potential.

5. The device according to claim 1, which further comprises, for differential operation:
  another recharging circuit connected in parallel to said recharging circuit and including a voltage divider connected in parallel to said recharging capacitor and having two resistors of equal size with a connection point therebetween;
  a switching transistor having a drain terminal connected to said connection point of said current source and said recharging capacitor and a source terminal connected to said node and to said connection point of said two resistors; and
  another switching transistor having a drain terminal connected to said node and a source terminal connected to reference potential.

6. The device according to claim 1, which further comprises a rectifier constructed as a synchronous demodulator with an input connected in single operation to said node of said charge balancing circuit.

7. The device according to claim 1, which further comprises, for differential operation:
  two changeover switches, said changeover switches in one setting connecting said input of said rectifier to said node of said charge balancing circuit and connecting another input of said rectifier to said other node of said charge balancing circuit, and said changeover switches in another setting connecting said input of said rectifier to said other node of said charge balancing circuit and connecting said other input of said rectifier to said node of said charge balancing circuit; and
  said two changeover switches being switched over synchronously by said activation signal AS of said switching transistor assigned to the cell having a charge voltage to be measured.

8. The device according to claim 1, which further comprises a resistor for single operation having one terminal connected to said node of said charge balancing circuit and another terminal connected to a reference voltage.

9. The device according to claim 1, which further comprises resistors for differential operation each having one terminal connected to a respective one of said nodes of said charge balancing circuit and another terminal applied to a reference voltage.

10. A multi-voltage motor vehicle electrical system, comprising:
  a double-layer capacitor including individual cells having first and second terminals; and
  a device for charge balancing between said individual cells, said device including:
    capacitors each being assigned to a respective one of said individual cells of said double-layer capacitor, said capacitors each having first and second terminals;
    first switches each for connecting said first terminal of one of said capacitors to said first terminal of said respective assigned cell;
    second switches each for connecting said first terminal of one of said capacitors to said second terminal of said respective assigned cell; and
    said second terminals of all of said capacitors being interconnected; wherein
  said first and second switches are MOS-FET switching transistors having source and drain terminals in a charge balancing circuit for single operation;
  said first terminals of said capacitors are each connected to said source terminal of a respective one of said first switching transistors and to said drain terminal of a respective one of said second switching transistors;
  a node is connected at said interconnected said second terminals of said capacitors;
  said drain terminals of said first switching transistors are each connected to said first terminal of the respective assigned cell; said source terminals of said second switching transistors are each connected to said second terminal of the respective assigned cell; and
  series circuits of two resistors are each connected in parallel to a respective one of the cells and each have a connection point connected to said first terminal of said respective assigned capacitor.

11. A method for operating the device according to claim 1, the method comprising the following steps:
  alternately switching said switching transistors assigned to a cell to be conductive with a predetermined frequency for measuring a charge voltage of the cell in single mode; and
  converting a square-wave ac voltage arising at said node at a high dc voltage potential in a rectifier to a dc voltage corresponding to the subsequently stored charge voltage with reference to a reference potential.

12. The method according to claim 11, which further comprises switching said switching transistors assigned to a cell to be conductive simultaneously and phase-opposed to others of said switching transistors, for measurement of the charge voltage of said cell with differential operation, causing square-wave alternating current voltages phase-opposed to each other to be produced at nodes and, with a peak-to-peak value being translated in said rectifier to a direct current voltage corresponding to a subsequently stored charge voltage with reference to reference potential.

13. The method according to claim 11, which further comprises measuring and storing the charge voltage of all of said cells at periodic intervals.

14. The method according to claim 11, which further comprises:
  comparing the stored values of the charge voltages of all of said cells at periodic intervals for differences therebetween and with a predetermined maximum value; and
  if one or more differences lie beyond a predetermined limit value or if one or more values lie beyond the predetermined maximum value, carrying out charge balancing consecutively between said cell being charged the most and said cell being charged the least.

15. The method according to claim 13, which further comprises forming a total of the stored values of the charge voltage and comparing the total with a predetermined minimum value, and, if the minimum value is undershot, recharging individual cells, cell groups or the entire double-layer capacitor from an external source of energy.

16. The method according to claim 14, which further comprises charge balancing from a more highly-charged cell to a less highly-charged cell in a single mode by:
  switching said first switching transistor of said more highly-charged cell and said first switching transistor of said less highly-charged cell to be conductive at a predetermined frequency in a first step, causing said capacitors connected in series, assigned to said cells to be charged to a voltage $V1=V_{C1}+V_{C2}+\ldots+V_{Cn-1}$; and
  switching said first switching transistors to be non-conductive and switching said second switching transistor of said more highly-charged cell and said second switching transistor of said less highly-charged cell to be conductive in a second step, with said cells having a lower voltage $V2 = VC2+\ldots+VCn-1+VCn$ than the voltage V1 at the capacitors;
  causing a balancing current to flow from said capacitors assigned to said cells to be recharged into said less highly-charged cell; and
  repeating said first and second steps until both cells exhibit approximately the same charge voltage.

17. The method according to claim 16, which further comprises, for differential operation:
  simultaneously switching said first switching transistors and said second switching transistors to be conductive in said first step; and
  simultaneously switching said second switching transistors and said first switching transistors to be conductive in said second step.

18. The method according to claim 16, which further comprises, for a fast charge balance in the double-layer capacitor:
  simultaneously switching all of said first switching transistors of one side and all of said second switching transistors of another side to be conductive in said first step; and
  simultaneously switching all of said second switching transistors of one side and all of said first switching transistors of another side to be conductive in said second step.

19. The method according to claim 15, which further comprises:
  charging said recharging capacitor through said switchable current source and a switch from an external source of energy with constant current to a predetermined voltage for recharging a cell; and
  subsequently transmitting charge from said recharging capacitor to said cell to be charged by:
    simultaneously switching said switching transistor and said first switching transistor assigned to said cell, to be charged to be conductive in single operation; and
    simultaneously switching said switching transistor, said first switching transistor assigned to said cell to be charged, said switching transistor and said second switching transistor assigned to said cell to be charged, to be conductive in differential operation.

20. The method according to claim 11, which further comprises executing all of said steps under program control with microprocessors.

* * * * *